United States Patent [19]
Kim et al.

[11] Patent Number: 5,833,815
[45] Date of Patent: Nov. 10, 1998

[54] SPUTTER DEPOSITION SYSTEM

[75] Inventors: Kyung Shik Kim, Tokyo; Tamio Yamada, Saitama-ken; Daisuke Aonuma, Tokyo; Yoshifumi Unehara, Tokyo, all of Japan

[73] Assignee: Anelva Corporation, Fuchu, Japan

[21] Appl. No.: 842,356

[22] Filed: Apr. 24, 1997

[30] Foreign Application Priority Data

Apr. 24, 1996 [JP] Japan ................................... 8-127923

[51] Int. Cl.⁶ ................................................ C23C 14/34
[52] U.S. Cl. .............................. 204/192.12; 204/298.19; 204/298.2; 204/298.23
[58] Field of Search ........................... 204/192.12, 298.2, 204/298.19, 298.23

[56] References Cited

U.S. PATENT DOCUMENTS

| | | | |
|---|---|---|---|
| 4,714,536 | 12/1987 | Freeman et al. | 204/298.2 X |
| 5,126,029 | 6/1992 | Tomer et al. | 204/298.2 X |
| 5,171,415 | 12/1992 | Miller et al. | 204/298.2 X |

FOREIGN PATENT DOCUMENTS 2707144  8/1977  Germany ............................ 204/298.2

*Primary Examiner*—Nam Nguyen
*Attorney, Agent, or Firm*—Burns, Doane, Swecker & Mathis, LLP

[57] ABSTRACT

A sputtering apparatus is equipped with a vacuum enclosure 11, a pumping mechanism 18 that evacuates the interior of the vacuum enclosure, magnetron cathodes 12a and 12b to which are attached targets 14, a gas feed mechanism 19 that feeds sputtering gas, and a substrate transfer mechanism. An electrical discharge is generated in the vicinity of the targets, thereby sputtering the targets, and sputter deposition is performed on substrates 15 that pass by facing onto the target surfaces. The magnetron cathodes are equipped with magnetron magnetic circuits 32, which are able to move, and the magnetron magnetic circuits are equipped with magnetron reciprocating mechanisms 33 including a left-right reciprocating part that reciprocates in the substrate transfer direction, which is parallel to the target surface, and an up-down reciprocating part that reciprocates in a direction perpendicular to the substrate transfer direction.

11 Claims, 17 Drawing Sheets rotation angle of motor causing up-down reciprocating motion (rad)

rotation angle of motor causing up-down reciprocating motion (rad)

phase lead of reciprocating motion in the Y direction (degrees) obtained by simulated results.

SPUTTER DEPOSITION SYSTEM

BACKGROUND OF THE INVENTION

1. Field of the Invention

The present invention relates to a sputter deposition system, and more particularly, it relates to a sputter deposition system wherein the magnetron cathode is free to move.

2. Description of Related Art

Conventional sputter deposition systems have hitherto mainly used magnetron sputtering methods with high deposition rates. As one example of such a device, the configuration of the typical elements of a conventional dual film deposition mode in-line sputter system and the operation thereof are described below with reference to FIG. 16.

FIG. 16 is a vertical cross-sectional illustration of the main parts of a vacuum enclosure forming a sputter deposition chamber. Magnetron cathodes 112a and 112b are provided at positions opposite upper wall part 111a and lower wall part 111b of vacuum enclosure 111. Two mutually parallel substrates 113 are simultaneously fed into vacuum enclosure 111, and are transferred from right to left in FIG. 16. The two substrates 113 are each transferred while being kept horizontal by trays 114. As the upper substrate 113 undergoes sputter processing by target 115 which has magnetron cathode 112a provided at its upper surface, the lower substrate 113 undergoes sputter processing by target 115 which has magnetron cathode 112b provided at its lower surface. Heater 116 is situated in the central part of the vacuum enclosure 111.

After the inner space 117 of the vacuum enclosure 111 has been pumped out to the order of $10^{-5}$ Pa by a pumping mechanism (not illustrated), a sputtering gas is fed by four gas pipes 118 into said inner space 117 and is held at a fixed process pressure. Shields 119 are provided around each of these gas pipes 118, whereby the sputtering gas is fed into vacuum enclosure 111 through gaps 110 in four places once it has flowed out inside shields 119 through gas injection ports 118a in four places.

Each of the above-mentioned magnetron cathodes 112a and 112b is configured from a cathode body 120 and a magnetron magnetic circuit 121. The target 115 is provided on the cathode body 120. An insulator 123 insulates the wall parts of vacuum enclosure 111 from the magnetron cathode. A target shield 124 is also provided. When a voltage is applied to the cathode bodies 120 of magnetron cathodes 112a and 112b from a power source (not illustrated), discharges occur between the targets 115 and their corresponding trays 114, whereby the targets 115 are sputtered and a film made of the target material is deposited on the substrate 113 mounted on each tray 114. While the sputter deposition is in progress, the trays 114 and substrates 113 are heated by said heater 116 and substrates 113 are held at a fixed temperature. Also, trays 114 are transferred in the direction of arrow 125 during sputter deposition.

As FIG. 17 shows, magnetron magnetic circuits 121 usually comprise a rod-shaped central magnet 126 (whose north pole faces the substrate), a peripheral magnet 127 (whose south pole faces the substrate) which has an open rectangular shape and is situated so as to surround the outside of said central magnet 126, and a flat rectangular yoke 128 that fixes, these magnets. As shown in FIG. 18, arch-shaped lines of magnetic force 129 are developed into a closed loop, or "torus", on target 115 by the magnetic field produced from magnetron magnetic circuit 121. Inside these lines of magnetic force 129, electrons produced on the targets 115 move over the targets 115 along helical paths through the interaction between the lines of electrical force arising from the voltage applied to targets 115 and the lines of magnetic force produced on targets 115 by magnetron magnetic circuits 121. As a result, the number of ionizing collisions between molecules of the sputtering gas and electrons inside vacuum enclosure 111 increases, producing a high-density plasma 130 inside the lines of magnetic force 129.

FIG. 19 shows a plan view of the high-density plasma 130, which is produced in a ring formation. Sputtering is performed by positive ions in high-density plasma 130 colliding with the surface of target 115, which has negative potential, and causing particles of the target to fly off from the target surface. As a result, the target particles sputtered by high-density plasma 130 accumulate on substrate 113, which is situated opposite this target 115, whereby the desired film is deposited at a high speed. When depositing on substrates with an in-line sputter deposition system, the two substrates 113 are transferred in parallel with the targets 115 of the respective magnetron cathodes 112a and 112b, and deposition is performed in the substrates as the substrates pass by the corresponding targets 115 while facing toward them.

In the above-mentioned sputter deposition system, since magnetron magnetic circuits 112a and 112b are fixed, deep erosion only occurs on target 115 in the racetrack portion where the high-density plasma 130 is produced, while the other portions are hardly sputtered at all. The conventional sputter deposition systems have thus suffered from the problem of low target use efficiency.

FIGS. 20 and 21 show the form in which target 115 is eroded by the above-mentioned conventional sputter deposition system: FIG. 20 is a vertical cross section across the width of the target and FIG. 21 is a vertical cross section along line A—A in FIG. 20. As these figures show, target 115 is only eroded at the portion over this racetrack. Moreover, the vertical cross section view of the target 115 shows the two vertical end parts 1151 and 1152 of the target are eroded more deeply than the central part 1153.

To make more effective use of target 115, a narrowed-down magnetron magnetic circuit 121 can be made to reciprocate in the substrate transfer direction 125. This reciprocation in the substrate transfer direction causes the high-density plasma 130 to reciprocate in the same direction at the central part of the target, and thus almost the entire surface of the target is eroded. However, since the two end parts 1261 and 1262 in FIG. 17 of magnetron magnetic circuit 121 that run parallel to the substrate transfer direction 125 constantly reciprocate over the same line, the vertical end parts 1151 and 1152 in FIG. 19 on the target corresponding to the two end parts 1261 and 1262 in FIG. 17 of the magnetron magnetic circuits are eroded to a greater depth than the central part 1253 of the target. Consequently, the two end parts of the target are eroded more deeply than the central part, and the lifetime of target 115 is determined by the erosion rate of the two end parts of the target. To put it another way, the two end parts running parallel to the substrate reciprocation direction are eroded to the bottom surface of the target before the central part of the target. Thus, there is little improvement in the target use efficiency, even though the entire surface of the central part of the target is eroded.

Also, in the above-mentioned reciprocation of magnetron magnetic circuit 121, when the reciprocation speed is of the same order or less than the transfer speed of the substrate, the relative speeds of substrate 113 and magnetron magnetic circuit 121 differ greatly in the direction in which the substrate progresses and in the opposite direction during the to-and-from motion of this reciprocation, and thus a distribution of film thickness occurs on the substrate in the transfer direction.

To make this film thickness distribution on the substrate uniform, a method has been considered wherein the film thickness uniformity in the substrate is improved by varying the electrical power according to variations in the relative speeds of substrate 113 and magnetron magnetic circuit 121. However, this leads to the problem that it is necessary to control the electrical power according to this variation of relative speed, and that the control system is complex.

Furthermore, in the case of reactive sputtering, a reactive gas is used in addition to the inert gas. When the electrical power is varied, the amount of particles sputtered from the target differs. Thus, to keep the substrate-to-substrate film properties constant during deposition, it is also necessary to control the flow rate of this reactive gas along with the electrical power. For example, in the deposition of a transparent oxide film such as an In—Sn—O based transparent conducting film, a mixture of Ar gas and $O_2$ gas is used as the sputtering gas. In this case, if the electrical power is varied then it is also necessary to control the flow rate of oxygen gas to a suitable flow rate for constant substrate-to-substrate film properties. Thus, since a reactive gas is normally used in active sputtering, the control becomes even more complex.

As mentioned above, when a fixed magnetron magnetic circuit 121 is used, the target use efficiency is low because sputtering is performed with plasma generated in a localized region. Also, when the magnetron magnetic circuit is made to reciprocate in the same direction as the substrate transfer direction, deep erosion occurs at the two ends of the magnetron magnetic circuit running parallel to the transfer direction of the substrate, which limits the target use efficiency.

Although the conventional sputter deposition system mentioned above has been described as operating in the in-line mode, similar problems can arise in batch processing mode and single substrate processing mode magnetron sputter deposition systems.

OBJECTS AND SUMMARY

The present invention aims to solve the above-mentioned problems and provide a sputter deposition system wherein the target use efficiency is improved by sputtering the entire surface of the target.

Furthermore, the present invention aims to provide a sputter deposition system that achieves a uniform film thickness distribution by making the depth of the erosion region of the target constant.

To achieve the above-mentioned aims, one embodiment of a sputter deposition system according to the present invention includes a magnetron cathode that is equipped with a first reciprocating mechanism (left-right reciprocating part) that is provided behind the target and causes the magnetron magnetic circuit to reciprocate parallel with the target surface in the substrate transfer direction, and a second reciprocating mechanism (up-down reciprocating part) that causes the magnetron magnetic circuit to reciprocate parallel with the target surface in a direction that is perpendicular to the substrate transfer direction. The sputter deposition system may further be equipped with a vacuum enclosure that forms a sputter deposition chamber, a pumping mechanism that evacuates the interior of said vacuum enclosure, a magnetron cathode to which is attached a target that faces into the interior of the vacuum enclosure, a gas feed mechanism that feeds sputtering gas into the interior of the vacuum enclosure, and a substrate transfer mechanism that transfers the substrate into the interior of the vacuum enclosure. A magnetron discharge is produced in the space neighboring the target inside the vacuum enclosure based on the applied electrical power, whereby the target of the magnetron cathode is sputtered and sputter deposition is performed on a substrate that passes by facing onto the target surface.

In the above-mentioned embodiment, the magnetron magnetic circuit is made free to move in a first direction, such as, for example, the substrate transfer direction, and in a second direction that is different from the first direction, such as, for example, a direction that is perpendicular to the substrate transfer direction by the first reciprocating mechanism and second reciprocating mechanism, respectively. At the target, the depth of errosion at the portion corresponding to the two end portions of the magnetron magnetic circuit (the shorter sides of the perimeter magnet) is either less than or nearly equal to the maximum depth in the central area of the target corresponding to the central portions of the magnetron magnetic circuit running parallel to the substrate transfer direction.

Thus by causing the magnetron magnetic circuit to reciprocate in the substrate transfer direction and the direction perpendicular thereto, the entire surface of the target is uniformly eroded. The target use efficiency is thus substantially improved.

DETAILED DESCRIPTION OF THE PREFERRED EMBODIMENTS

A preferred embodiment of the present invention is described below with reference to the supplementary figures.

Figure 1:
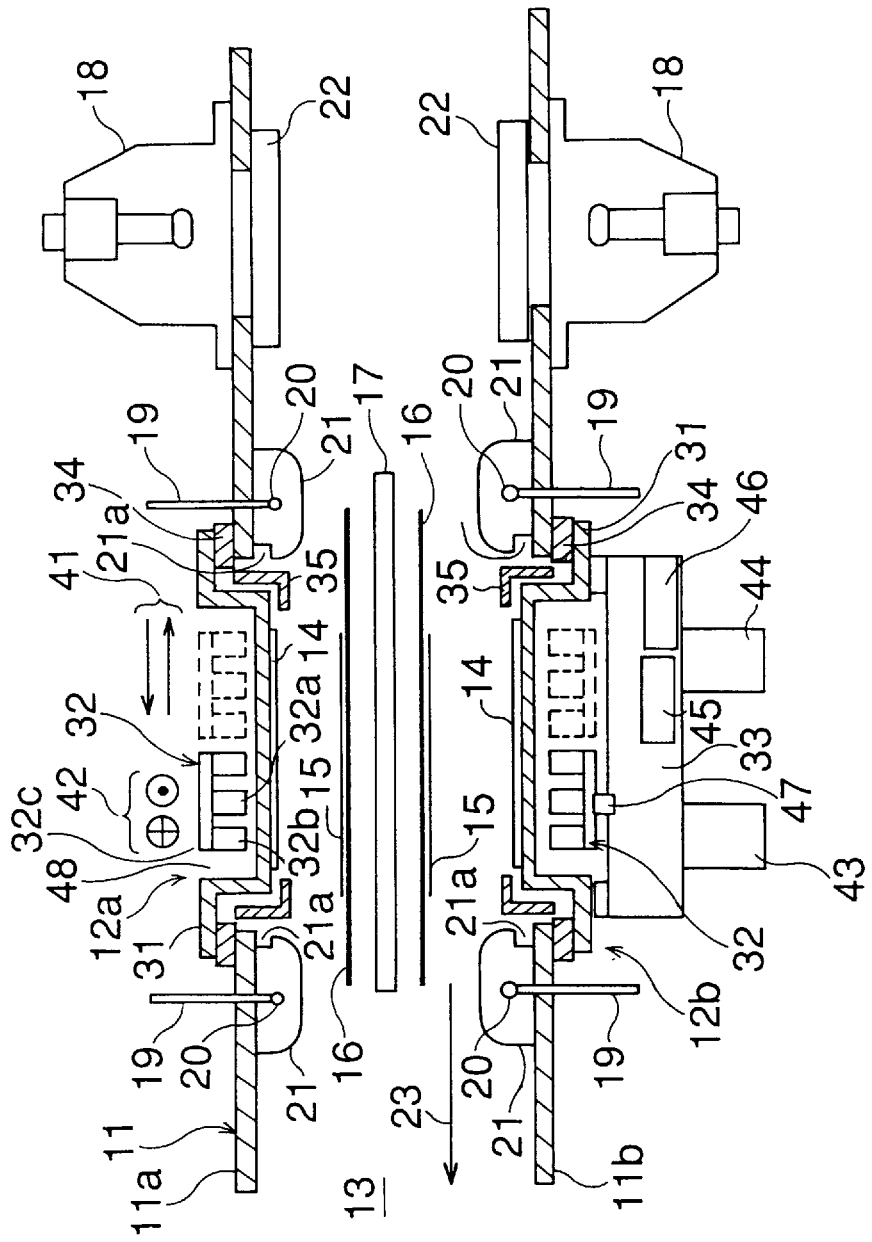
FIG. 1 is a vertical cross-sectional view of the main parts of a sputter deposition system according to the present invention.
Figure 16:
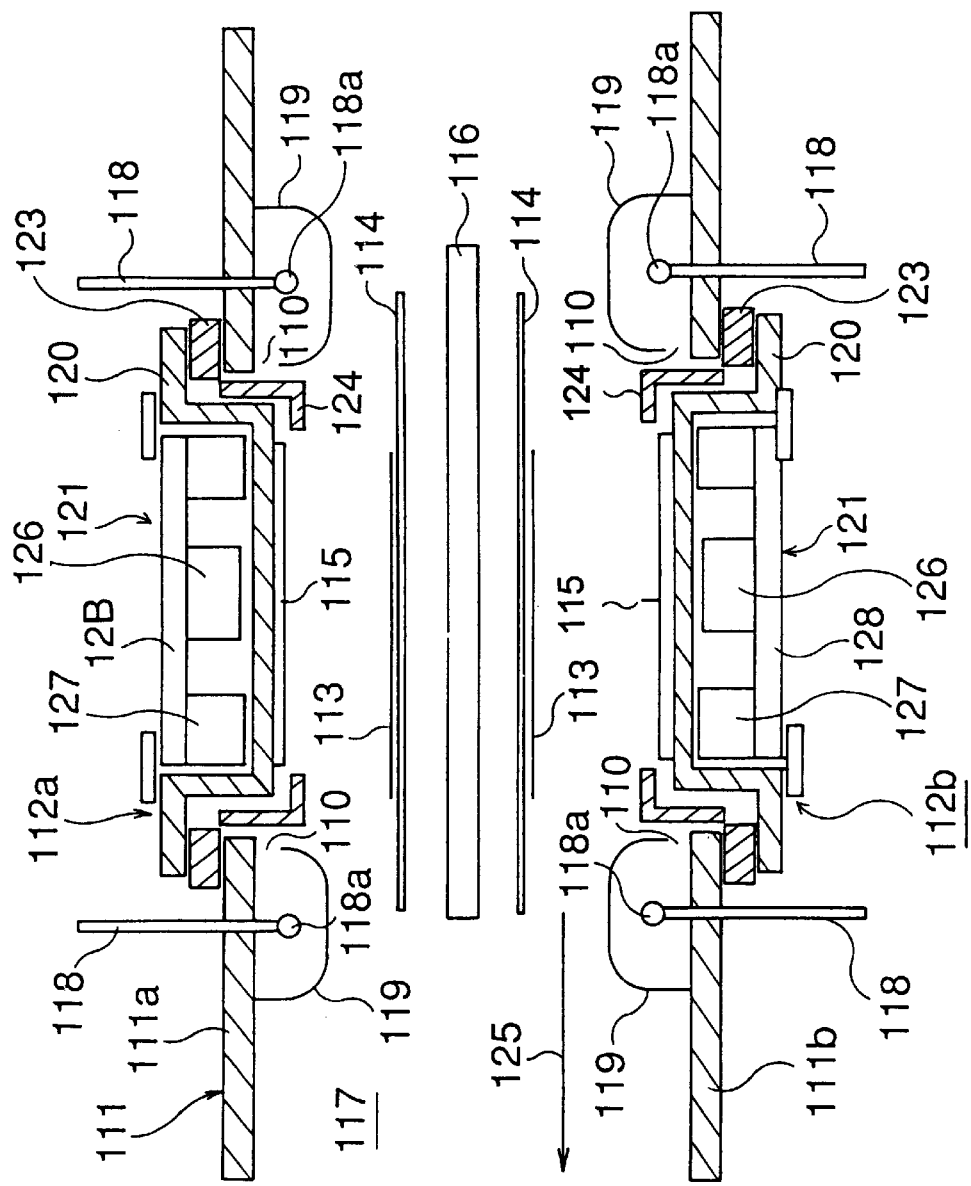
FIG. 16 illustrates a vertical cross section showing the configuration of a conventional in-line sputter deposition system.
Figure 17:
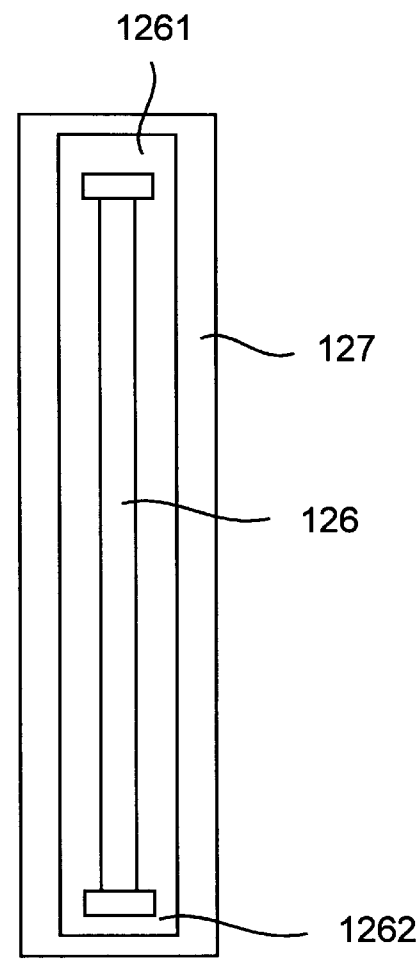
FIG. 17 is a front view of the magnetron magnetic circuit of FIG. 16.
Figure 18:
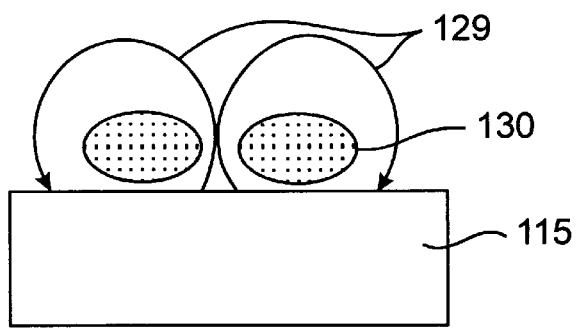
FIG. 18 illustrates the lines of magnetic force and the high density plasma generation mode on the target by the system of FIG. 16.
Figure 19:
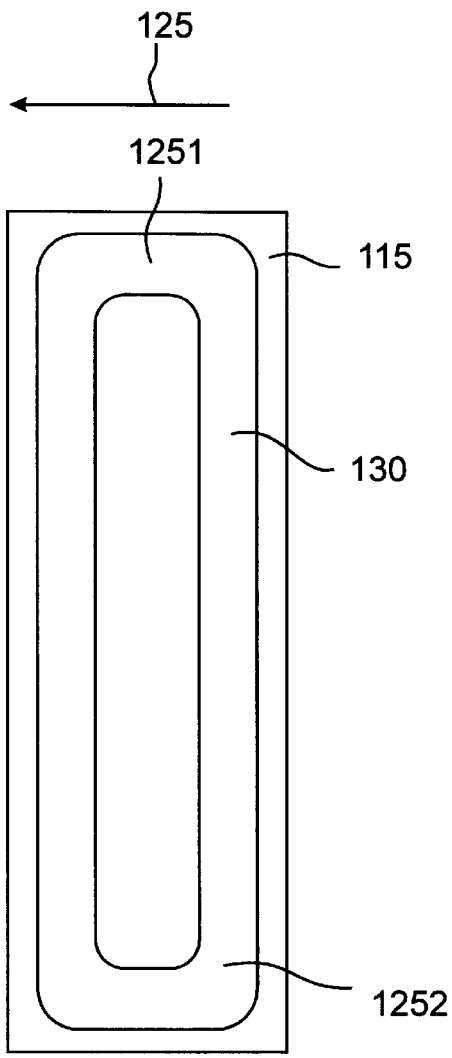
FIG. 19 is a plan view showing the high density plasma generation mode on the target of FIG. 16.
Figure 20:
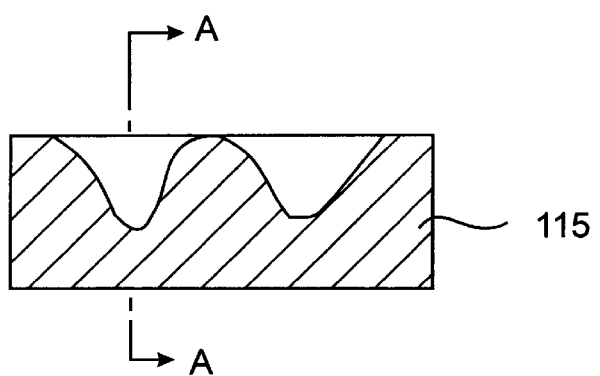
FIG. 20 is a cross-sectional view showing the target erosion mode of FIG. 19.
Figure 21:
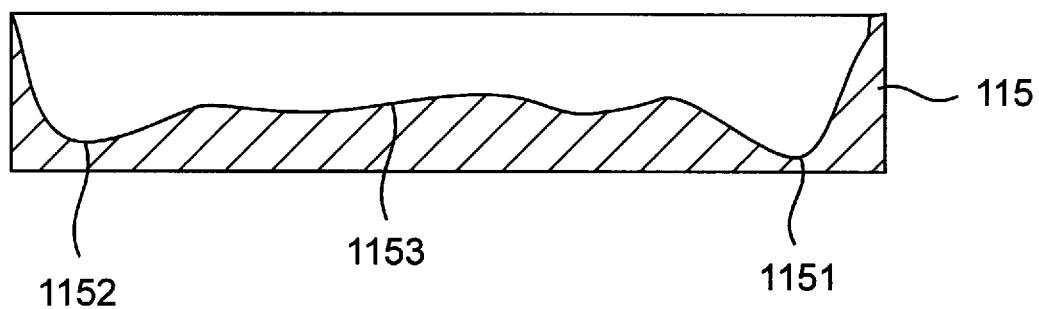
FIG. 21 is a cross section along line A—A in FIG. 20.

FIG. 1 is a cross-sectional view of the main parts of an in-line sputter deposition system according to a typical embodiment of the present invention. The parts of the basic configuration are essentially the same as those of the configuration of the conventional device described in FIG. 16, except as described herein.

The present invention is not limited to in-line mode systems, and can also be applied to batch processing mode and single substrate processing mode systems. Also, although this embodiment shows a dual sputter deposition system that performs film deposition simultaneously on two substrates arranged in parallel in the sputter deposition chamber, the present invention is not limited thereto.

In FIG. 1, magnetron cathodes 12a and 12b are provided on the upper wall part 11a and lower wall part 11b, respectively, of vacuum enclosure 11 which forms the sputter deposition chamber. Magnetron cathodes 12a and 12b face each other from opposite sides of inner space 13 of vacuum enclosure 11. Targets 14 are attached to magnetron cathodes 12a and 12b, from where they face into inner space 13 of vacuum enclosure 11.

In this sputter deposition chamber, two substrates 15 are transferred from right to left in FIG. 1. The two substrates 15 are each transferred while being kept horizontal by trays 16, during which the upper substrate is subjected to sputter processing by target 14 provided on magnetron cathode 12a and the lower substrate is subjected to sputter processing by target 14 provided on magnetron cathode 12b. The substrates 15 and trays 16 are transferred by a conventional tray transfer mechanism (not illustrated). The two trays 16 are transferred as a pair in parallel alignment. During film deposition, the substrates 15 are heated to the desired temperature by a heater 17 which is situated at a central position inside vacuum enclosure 11. After the interior of vacuum enclosure 11 has been pumped out, preferably to the order of $10^{-5}$ Pa, by two pumping mechanisms 18, sputtering gas is fed into, inner space 13 by, for example, four gas pipes 19. The sputtering gas is then set to the pressure required for sputter processing.

Also, a gas injection port 20 and a shield 21 are provided around each gas pipe 19. A gap 21a is provided for allowing the sputtering gas to flow out from shield 21. A main valve 22 is also provided, and reference number 23 is the substrate transfer direction.

Magnetron cathodes 12a and 12b are basically configured from a cathode body 31 which serves both as a target fixture and as a vacuum seal. A magnetron magnetic circuit 32 is provided behind target 14, and insulator 34 electrically insulates the wall part of the vacuum enclosure from the magnetron cathode and the target seal 35. However, magnetron cathodes 12a and 12b are further equipped with a magnetron cathode reciprocating mechanism 33 which simultaneously moves magnetron magnetic circuit 32 in the substrate transfer direction and in a direction perpendicular thereto while keeping it parallel with the target surface.

In the present embodiment, a special feature of magnetron magnetic circuit 32 is that it can be moved at will by magnetron cathode reciprocating mechanism 33 according to the vectorial composite of the movement vector in the substrate transfer direction and the movement vector in the perpendicular direction. The above-mentioned targets 14 are attached at the surface of inner space 13 of cathode body 31 so as to face into the inner space of vacuum enclosure 11.

The two magnetron cathodes 12a and 12b have the same structure, but the magnetron reciprocating mechanism 33 of the upper magnetron cathode 12a has been omitted from the figure in order to show the reciprocation direction of magnetron magnetic circuit 32.

Magnetron magnetic circuit 32 comprises a central magnet 32a, a peripheral magnet 32b, and a yoke 32c. This structure may be the same as that of a conventional magnetron magnetic circuit. The surface of central magnet 32a on the target side is its north pole, and the surface of peripheral magnet 32b on the target side is its south pole. Each of the surfaces of central magnet 32a and peripheral magnet 32b on the target side are parallel with the surface of target 14. Arch-shaped lines of magnetic force are developed into a closed loop, or "torus", on the surface of target 14 by the magnetron magnetic circuit 32. Electrons move along helical paths in the lines of magnetic force through the interaction between these lines of magnetic force and the lines of electrical force arising from the voltage applied to targets 14. As a result, the number of ionizing collisions between molecules of the sputtering gas and electrons inside vacuum enclosure 11 increases, producing a high-density magnetron plasma inside the magnetic field.

When a voltage is applied to cathode body 31 from a power source (not illustrated), discharges occur between the targets 14 and their corresponding trays 16. As a result, the targets 14 are sputtered by the magnetron plasma and a film made of the target material is deposited on the substrate 15 on each tray 16. While the sputter deposition is in progress, the trays 16 and substrates 15 are heated by heater 17.

The basic operation of the above-mentioned sputter deposition system and the configuration relating to this operation are described below. After main valve 22 has been opened and inner space 13 of vacuum enclosure 11 has been evacuated by pumping mechanism 18, heater 17 is switched on. A thermocouple (not illustrated) is attached inside heater 17 and the temperature of heater 17 is measured by this thermocouple. The electric power supplied to the heater is controlled by a temperature control unit (not illustrated) so that it reaches a set temperature. Also, substrates 15 are respectively mounted on a plurality of pairs of trays 16, and are continuously transferred by a known tray transfer mechanism inside inner space 13 of vacuum enclosure 11.

Sputtering gas is supplied to inner space 13 of vacuum enclosure 11 via gas pipes 19 from a gas feed mechanism (not illustrated). Once the sputtering gas has been injected inside shields 21 from gas pipes 19, it is then injected from gas injection ports 20 toward the surface of targets 14. An inert sputtering gas such as Ar is normally used for the deposition of metal films, an inert gas and oxygen gas are used for the deposition of oxides, and an inert gas to which nitrogen gas has been added is used for the deposition of nitrides.

Magnetron reciprocating mechanisms 33 are then operated in the operating mode described below, and electric power is supplied to cathode bodies 31 from the power source (not illustrated). The cathode bodies 31 are made of metal, and support the targets 14. The cathode bodies 31 are electrically connected to metal backing plates (not illustrated). Magnetron plasma is generated on targets 14. When targets 14 are made of an insulating material, RF (radio frequency) electrical power is supplied to cathode bodies 31. Deposition is performed continuously on substrates 15 by continuously transferring the substrates 15 and by the positive ions in the plasma sputtering the surface of targets 14.

Next, the detailed configuration of a magnetron reciprocating mechanism 33 and the associated operation of magnetron magnetic circuit 32 are described. The operation of magnetron magnetic circuit 32 is the composite of the reciprocating motion 41 in the direction parallel to the substrate transfer direction 23 (the left-right direction in FIG. 2) and the reciprocating motion 42 in the direction perpendicular to the substrate transfer direction 41 (the up-down direction in FIG. 2).

As shown in FIG. 1, magnetron reciprocating mechanism 33 is equipped with a motor 43 that produces reciprocating motion 42, a motor 44 that produces reciprocating motion 41, a phase controller 45, and a reciprocative frequency controller 46. The positional configuration of motors 43 and 44 shown in FIG. 1 is schematic and thus not necessarily drawn to scale. A typical example of the configuration is clarified in a specific example below.

Magnetron reciprocating mechanism 33 and magnetron magnetic circuit 32 are linked together by a connecting part 47. The purpose of phase controller 45 is to correct and control the phase of the reciprocating motion of magnetron magnetic circuit 32 to a suitable phase. With phase controller 45, it is possible to obtain the maximum target use efficiency if the phase difference is preferably set to 0 rad or ¼π rad when the reciprocation period of reciprocating motion 41 in the left-right direction is four times the reciprocation period of reciprocating motion 42 in the up-down direction. Also, a reciprocation frequency controller 46 is provided to control the frequency of reciprocating motions 41 and 42.

Figure 2:
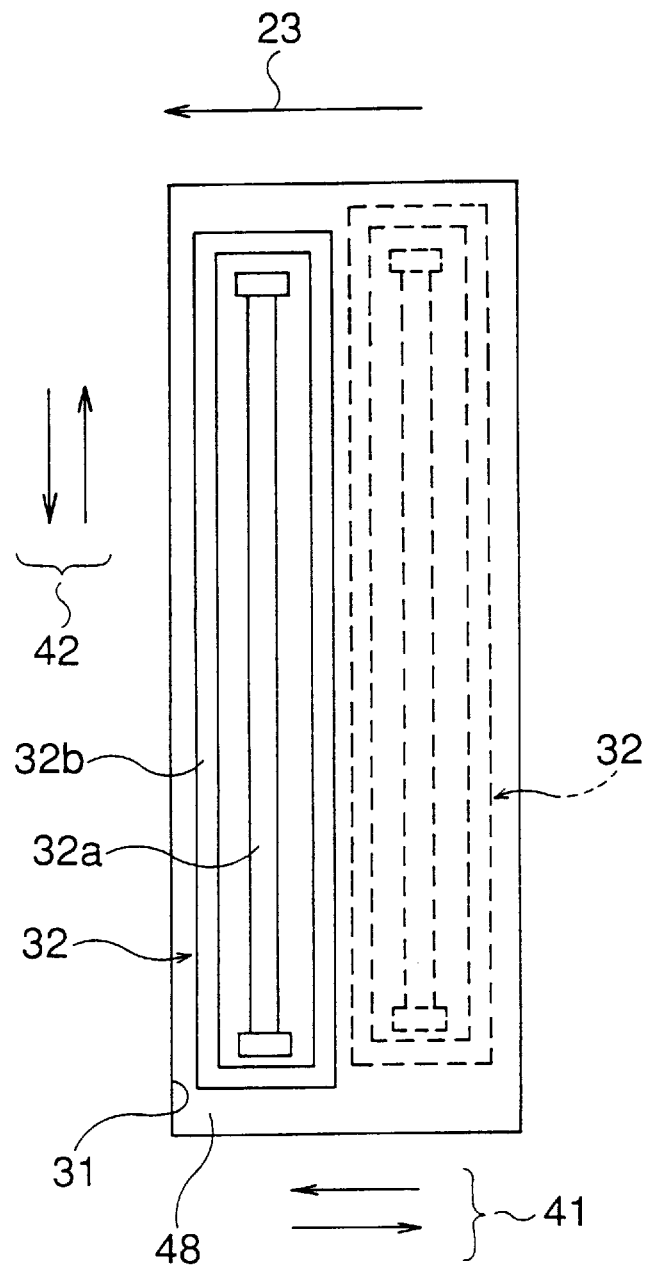
FIG. 2 illustrates the reciprocating mode of the magnetron magnetic circuit.

FIG. 2 is a view of the reciprocating motion of magnetron magnetic circuit 32 at the top of FIG. 1 as seen from the side of target 14. In FIG. 2, a recessed region 48 is formed behind cathode body 31 to accommodate the magnetron magnetic circuit 32. In recessed region 48, magnetron magnetic circuit 32 performs reciprocating motion 41 in a direction parallel to the substrate transfer direction 23, and performs reciprocating motion 42 simultaneously in a direction perpendicular to the substrate transfer direction 23. The movement of magnetron magnetic circuit 32 is the vectorial composite of the two reciprocating motions 41 and 42. The solid line in FIG. 2 shows magnetron magnetic circuit 32 situated at the bottom left side of its movement, while the broken line shows magnetron magnetic circuit 32 situated at the top right side of its movement. By causing magnetron magnetic circuit 32 to reciprocate continuously in directions parallel to (left-right) and perpendicular to (up-down) substrate transfer direction 23, the entire surface of target 14 is uniformly eroded.

Figure 3:
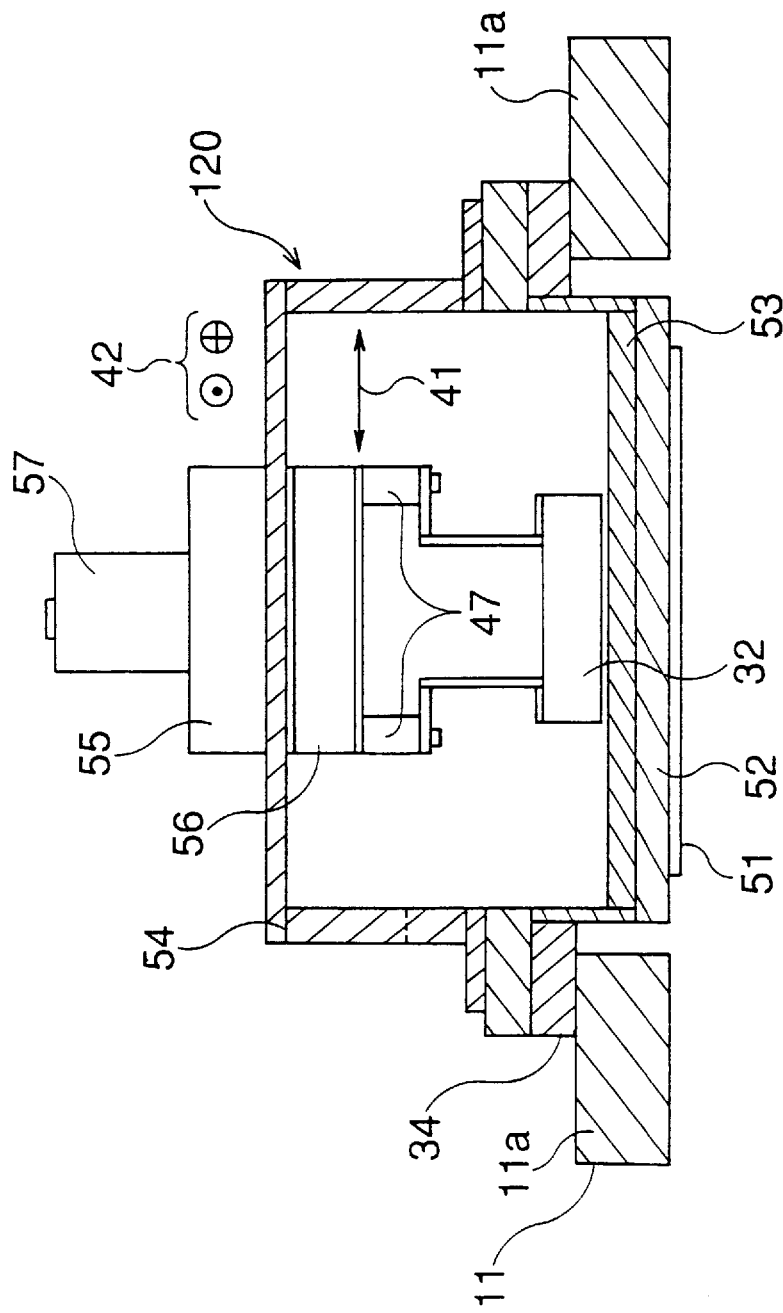
FIG. 3 is a vertical cross-sectional view showing an example of a magnetron reciprocating mechanism.

FIG. 3 shows a magnetron cathode 120 equipped with a magnetron reciprocating mechanism 33, which makes it possible for magnetron magnetic circuit 32 to reciprocate. This magnetron cathode 120 is provided on the upper wall part 11a of vacuum enclosure 11. The same reference numbers are used for those elements in FIG. 3 that are essentially the same as those in FIG. 1. In FIG. 3, the parts corresponding to target 14 are target material 51 and a backing plate 52. Reference number 53 is the cathode body. The cathode body 53 is fixed to upper wall part 11a via an insulator 34. A frame 54 is attached behind cathode body 53. Up-down reciprocating part 55 and left-right reciprocating part 56 are supported by frame 54, and a motor 57 is also attached thereto. Magnetron magnetic circuit 32 is attached to the underside of left-right reciprocating part 56 via connecting parts 47. Up-down reciprocating part 55 incorporates a mechanism that causes magnetron magnetic circuit 32 to reciprocate in up-down direction 42 under the power of motor 57, and left-right reciprocating part 56 similarly incorporates a mechanism that causes magnetron magnetic circuit 32 to reciprocate in left-right direction 41 under the power of motor 57. The magnetron reciprocating mechanism 33 of FIG. 1 comprises up-down reciprocating part 55 and left-right reciprocating part 56. A more specific example of the configuration of up-down reciprocating part 55 and left-right reciprocating part 56 is described below. The vacuum enclosure 11 and cathode body 53 are electrically insulated by insulating body 34.

Figure 4:
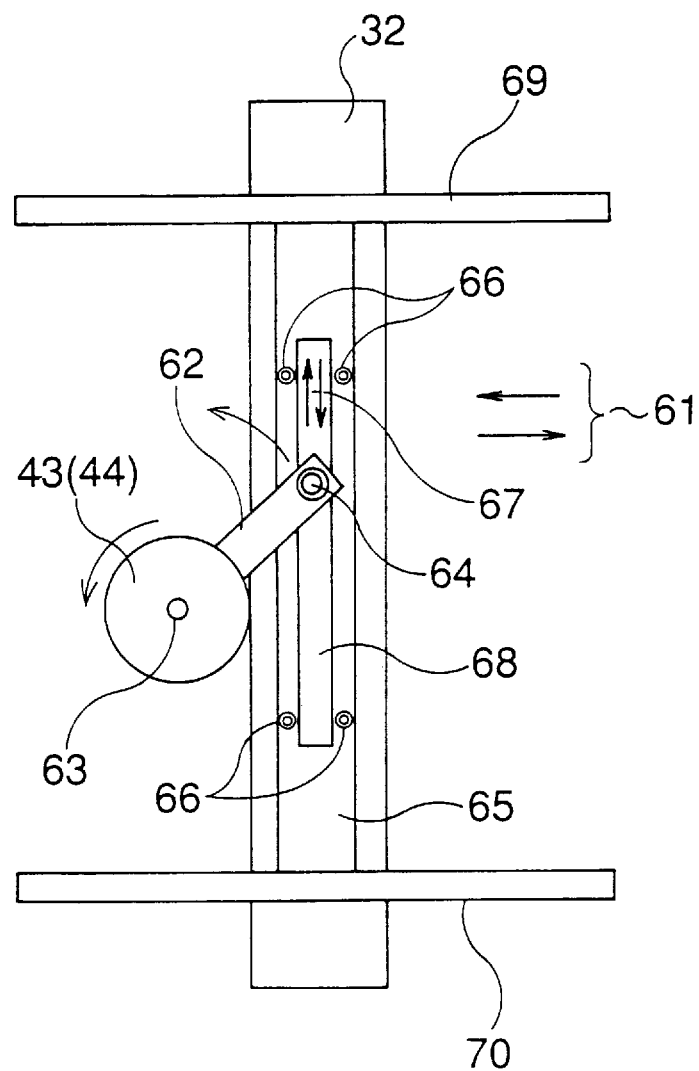
FIG. 4 is a plan view of the basic configuration for configuring a magnetron reciprocating mechanism.
Figure 5A:
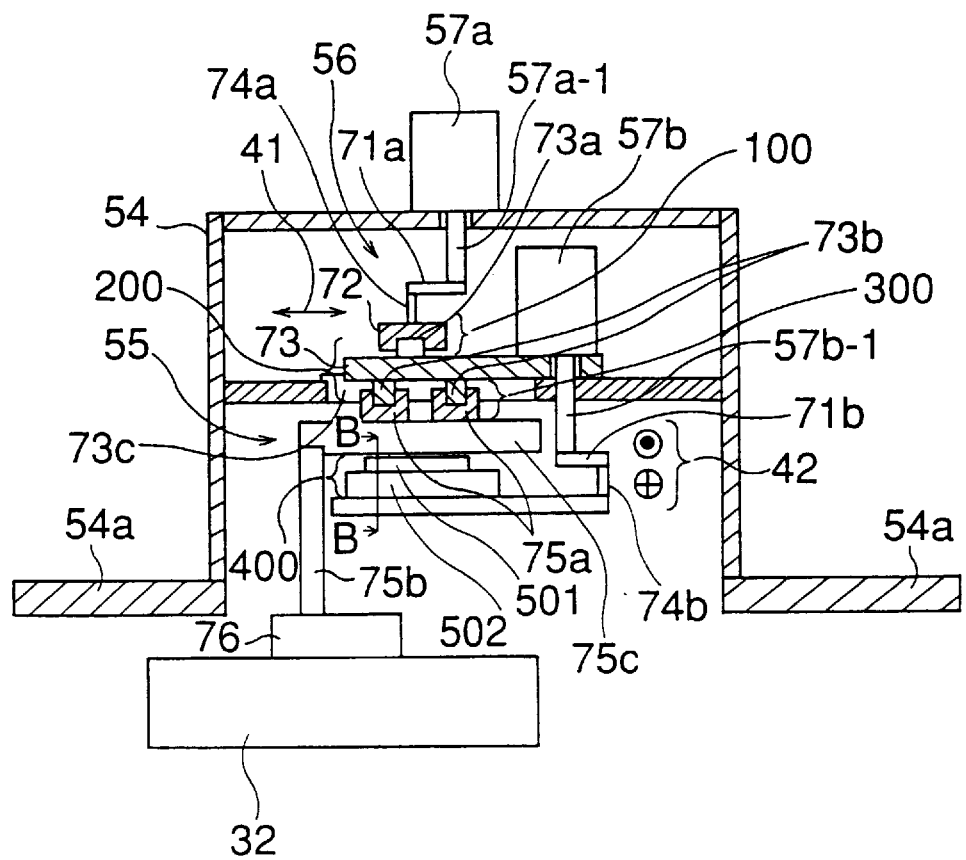
FIG. 5A is a vertical cross-sectional view showing a specific example of a magnetron reciprocating mechanism made by combining the basic configuration shown in FIG. 4.
Figure 5B:
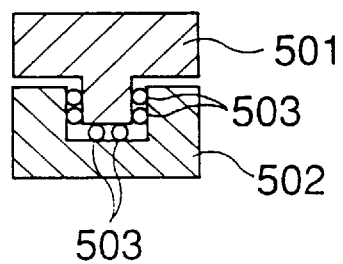
FIG. 5B is a cross section of FIG. 5A along line B—B.

Next, an example of the basic mechanism for realizing magnetron reciprocating mechanism 33 (the mechanism including up-down reciprocating part 55 and left-right reciprocating part 56 in FIG. 3) and a specific configuration example of its assembly and configuration are described with reference to FIG. 4, FIG. 5A and FIG. 5B. FIG. 4 shows an example of the basic configuration, while FIGS. 5A and 5B show a specific configuration example. In FIGS. 4, 5A, and 5B, the same reference numbers are applied to elements that are essentially the same as the elements mentioned above.

FIG. 4 is a view seen from behind magnetron magnetic circuit 32. Magnetron magnetic circuit 32 reciprocates along a sinusoidal path as time passes. Magnetron magnetic circuit 32 reciprocates only in the direction of arrows 61. This reciprocating motion is produced by the rotation of an arm 62 as motor 43 (or motor 44) rotates. Rotary shafts 63, 64 are at the ends of arm 62, and these rotary shafts 63, 64 allow arm 62 to rotate freely. Rotary shaft 63 is linked to the rotary drive shaft of motor 43, and rotary shaft 64 is able to slide freely as shown by arrows 67 in a slider 68 of a mount 65 which is fixed by fixing screws 66 to the back of magnetron magnetic circuit 32. The mount 65 is prevented from moving in the direction of arrows 67 by guide members 69 and 70, which double as fixed parallel sliders. Thus magnetron magnetic circuit 32 is not able to move freely in the direction of arrows 67. In this way, the reciprocation of magnetron magnetic circuit 32 is restricted to the direction of arrows 61. When arm 62 rotates about rotary shaft 63, rotary shaft 64 performs a uniform circular motion. The slider 68 provided on rotary shaft 64 then moves freely in the direction of arrows 67. Since the movement of magnetron magnetic circuit 32 is restrained by guide members 69 and 70, which double as sliders, it does not move in the same direction. As a result, the reciprocation of magnetron magnetic circuit 32 is restricted to only the direction of arrows 61. Magnetron magnetic circuit 32 thus performs reciprocating motion having a speed variation that follows a sine wave in the direction of arrows 61. The mechanism shown in FIG. 4 is used for the magnetron reciprocating mechanism shown in FIG. 1 or FIG. 3. The direction shown by the above-mentioned arrows 61 corresponds to the left-right reciprocating motion 41, and the left-right reciprocating part 56 uses the mechanism shown in FIG. 4.

FIG. 5A shows frame 54, which is provided with a motor 57a for left-right reciprocation, a motor 57b for up-down reciprocation, a left-right reciprocating part 56 and an up-down reciprocating part 55. The bottom edge part of frame 54 is fixed to the opposite edge part at the above-mentioned cathode body 53. The mechanism shown in FIG. 5A includes slider structure parts in four places: a first slider 100, a second slider 200, a third slider 300 and a fourth slider 400. As can be clearly seen from FIG. 5B, which shows a cross section along line B—B in FIG. 5A, sliders 100 and 200 are both provided with ball bearings 503 between slider protruding part 501 and slider indented part 502, which are engaged with each other. The slider protruding part 501 and slider indented part 502 slide smoothly relative to each other.

To describe the configuration in more detail, left-right reciprocating part 56 comprises an arm 71a, a first slider 100 and a second slider 200. The first slider 100 comprises a slider indented part 72, a slider projecting part 73a, and ball bearings (not illustrated). The second slider 200 comprises a slider projecting part 73c, a slider indented part 73 and ball bearings (not illustrated). A motor 57b is attached to the top of second slider 200. One end of arm 71a is connected to a rotary drive shaft 57a-1 of motor 57a. When motor 57a operates, the driving force is transmitted via arm 71a and connecting rod 74a, and slider indented part 73 of second slider 200 is made to reciprocate in left-right direction 41 by the linkage relationships of first slider 100 and second slider 200. The slider projecting part 73c of second slider 200 is fixed to frame 54, and is functionally equivalent to guide members 69 and 70 shown in FIG. 4 which double as sliders.

Up-down reciprocating part 55 comprises an arm 71b, third slider 300 and fourth slider 400. One end of arm 71b is connected to rotary drive shaft 57b-1 of motor 57b. The third slider 300 comprises a slider projecting part 73b, a slider indented part 75a and ball bearings (not illustrated). The slider projecting part 73b is equivalent to the guide member doubling as a slider described in FIG. 4. As shown in FIG. 5B, fourth slider 400 also comprises a slider projecting part, a slider indented part and ball bearings (not illustrated). The above-mentioned slider indented part 75a is fixed to the top part of member 75c, and slider projecting part 501 of fourth slider 400 is fixed to the bottom part of member 75c. Also, slider indented part 502 of fourth slider 400 is connected to the other end of arm 71b by connecting part 74c. Magnetron magnetic circuit 32 is linked to member 75c via a fixing mount 76 and a reciprocating connecting part 75b. In this structure, when motor 57b operates, reciprocating connecting part 75b is made to reciprocate in up-down direction 42 by third slider 300 and fourth slider 400.

With the above-mentioned configuration, reciprocating connecting part 75b is made to perform up-down and left-right reciprocating motion based on the combination of the reciprocating motion in the above-mentioned left-right direction 41 and the reciprocating motion in the above-mentioned up-down direction 42. Fixing mount 76, which is connected to reciprocating connecting part 75b, and magnetron magnetic circuit 32 also perform up-down and left-right reciprocating motion.

Figure 6:
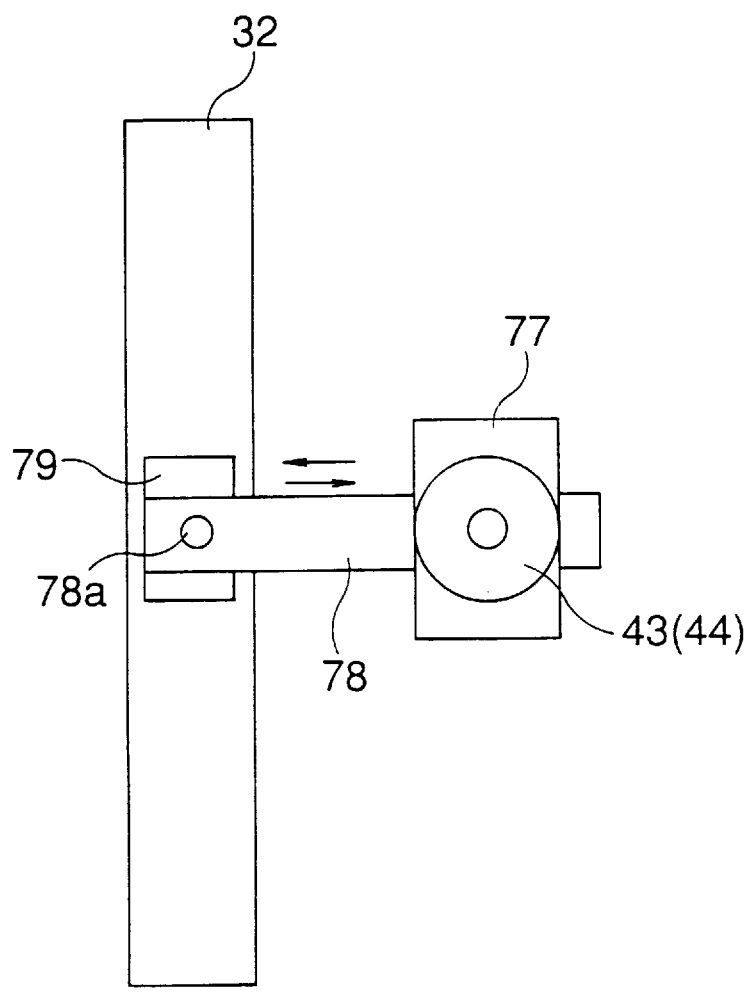
FIG. 6 is a plan view showing another basic configuration for configuring a magnetron reciprocating mechanism.

FIG. 6 shows another mechanism that performs a constant-speed linear to and from motion. FIG. 6, like FIG. 4, is a view seen from behind magnetron magnetic circuit 32. The rotary motion of motor 43 (or motor 44) causes a reciprocating connecting part 78 to move in a straight line via a gearbox 77. In this case, shaft 78a does not rotate, and magnetron magnetic circuit 32 is connected to reciprocating connecting part 78 via a fixing mount 79. As motor 43 rotates in forward and reverse directions, reciprocating connecting part 78 reciprocates in the longitudinal direction and reciprocates at constant speed in a straight line.

As in the case of the configuration shown in FIG. 4, by combining two of the mechanisms shown in FIG. 6 so that magnetron magnetic circuit 32 reciprocates in the up-down direction and the left-right direction, it is possible to configure the magnetron reciprocating mechanisms shown in FIG. 3 and FIG. 5.

Figure 7:
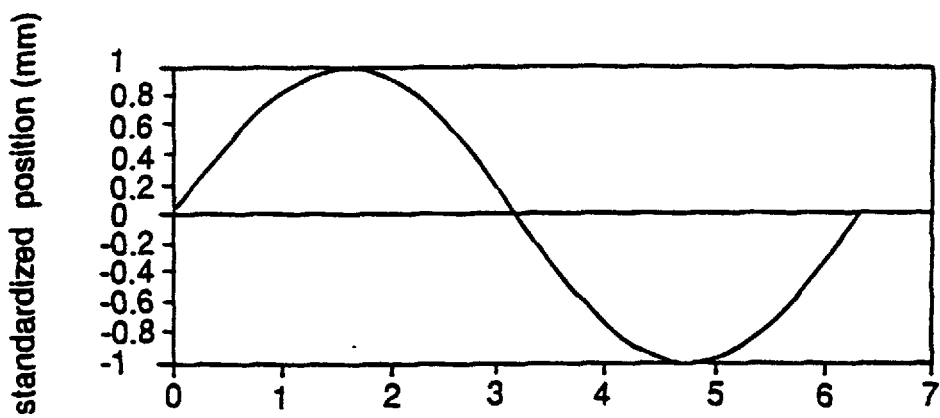
FIG. 7 illustrates the motor rotation angle dependence of the motor in the reciprocating motion in the left-right direction.
Figure 8:
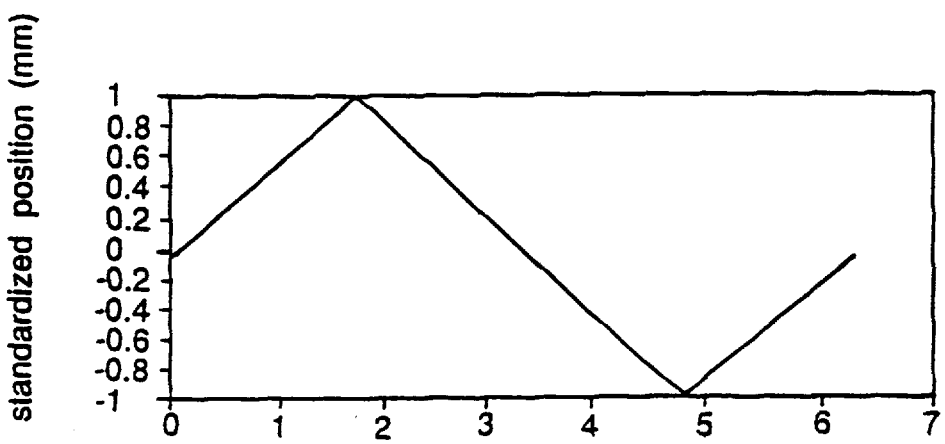
FIG. 8 illustrates the motor rotation angle dependence of the motor in the reciprocating motion in the left-right direction.

FIGS. 7 and 8 show the time variation of the reciprocating position as the motor rotates in reciprocating motion in the left-right direction.

Figure 9:
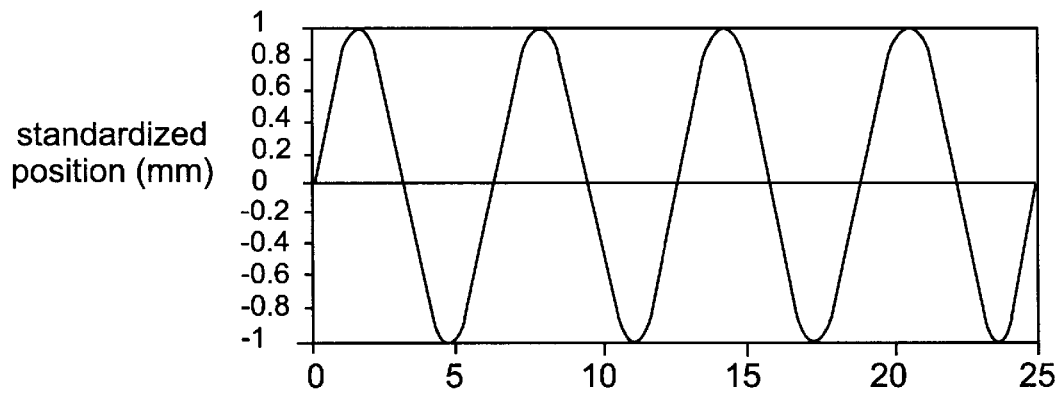
FIG. 9 illustrates the time variation of the reciprocation position as the motor rotates up-down.
Figure 10:
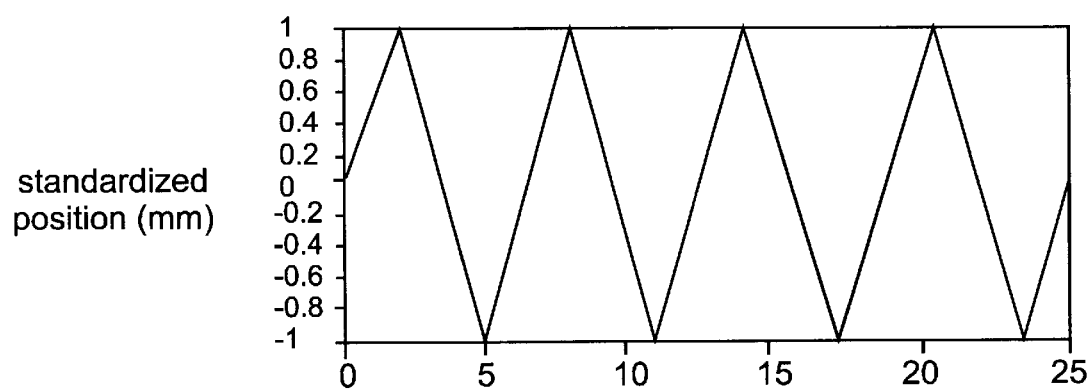
FIG. 10 illustrates the time variation of the reciprocation position as the motor rotates up-down.

FIGS. 9 and 10 show the motor rotation angle dependence in the reciprocating motion in up-down direction 42 when the motor has made one revolution (rotational angle 2π rad) in the reciprocating motion in the left-right direction. As shown, the motor, which causes reciprocating motion in the up-down direction, turns four times in the time it takes for the motor that causes reciprocation in the left-right direction to turn once. In FIGS. 7 through 10, the "standardized position" is the value obtained by dividing the position of each reciprocating point by half the maximum reciprocation amplitude.

Figure 11:
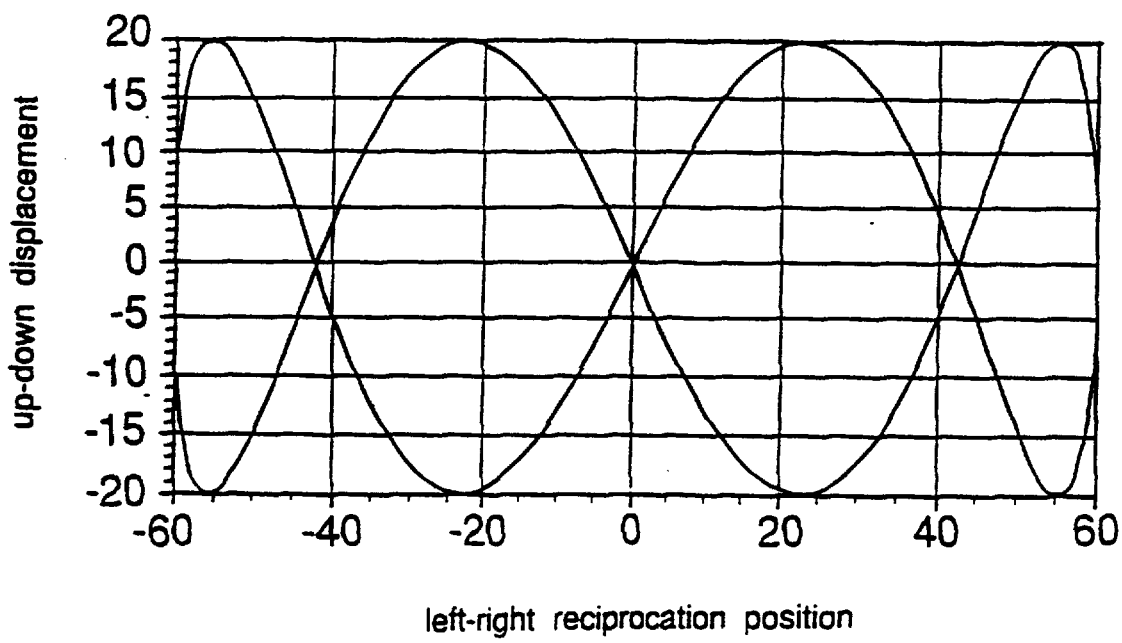
FIG. 11 illustrates the reciprocation path of the magnetron magnetic circuit when the rotation angle phase of the motor that causes reciprocation in the left-right direction is 0 rad and ¼π rad.
Figure 12:
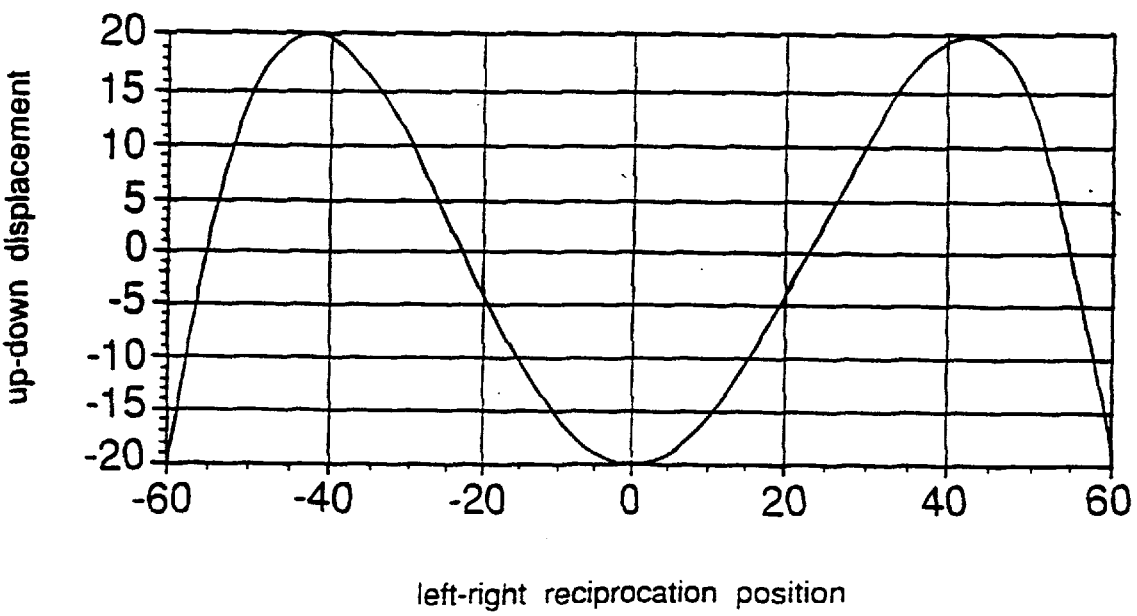
FIG. 12 illustrates the reciprocation path of the magnetron magnetic circuit when the rotation angle phase of the motor that causes reciprocation in the left-right direction is ⅛π rad.

FIG. 11 shows the reciprocation path of magnetron magnetic circuit 32 when the rotation angle phase of the motor that causes reciprocation in left-right direction 41 is 0 rad and when it is ¼π rad. In this case, apart from a few points of intersection, the reciprocation path of magnetron magnetic circuit 32 does not overlap itself while the reciprocating path in the left-right direction performs one to-and-from motion. With a reciprocation path that does not overlap itself, the target use efficiency is increased. On the other hand, when the rotation angle phase of the motor that causes reciprocation in left-right direction 41 is ⅛π rad, as in FIG. 12, the reciprocation path of magnetron magnetic circuit 32 overlaps itself during the to-and-from motion, so that the target use efficiency is decreased.

Figure 13A:
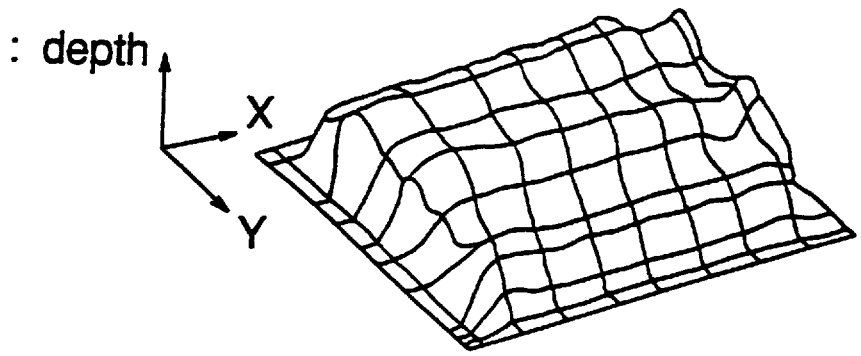
FIG. 13A illustrates a simulation of the target use efficiency.
Figure 13B:
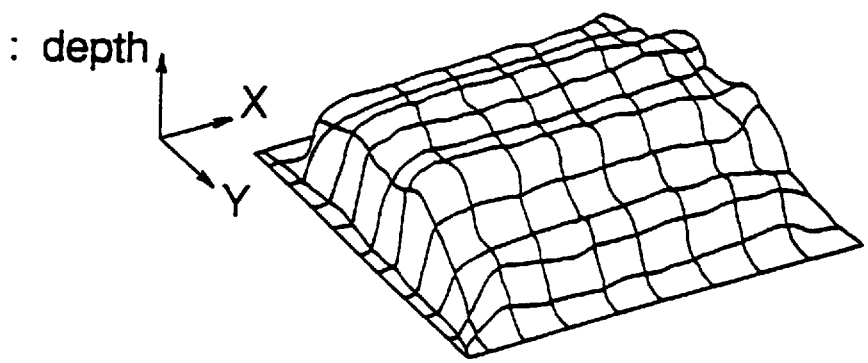
FIG. 13B illustrates a simulation of the target use efficiency with a reciprocation amplitude.
Figure 13C:
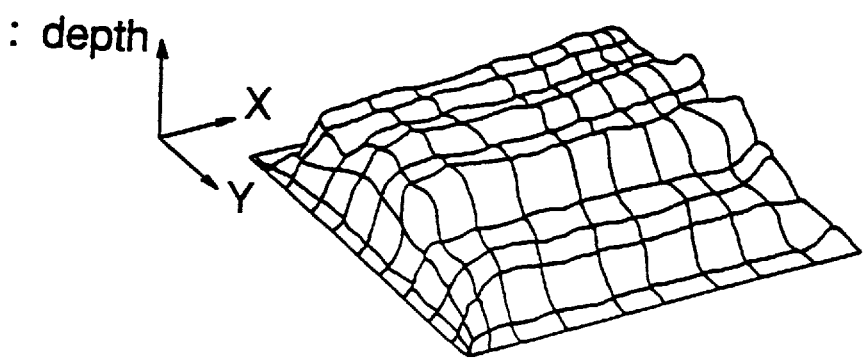
FIG. 13C illustrates a simulation of the target use efficiency.
Figure 14A:
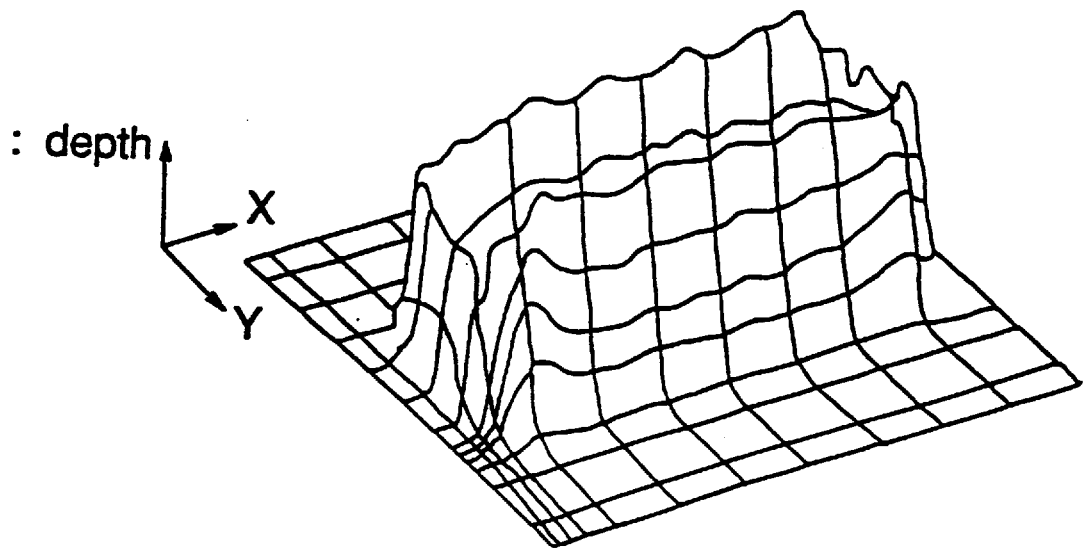
FIG. 14A illustrates simulated results of the target use efficiency.
Figure 14B:
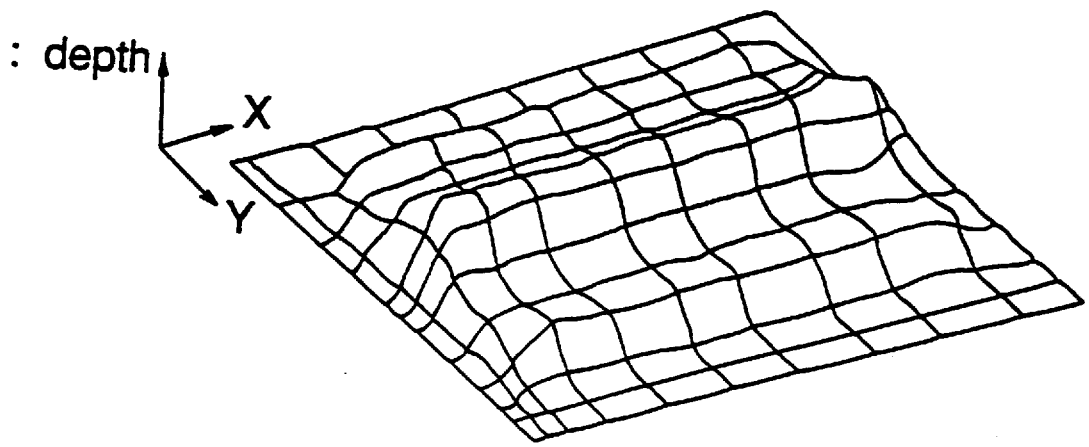
FIG. 14B illustrates simulated results of the target use efficiency.
Figure 14C:
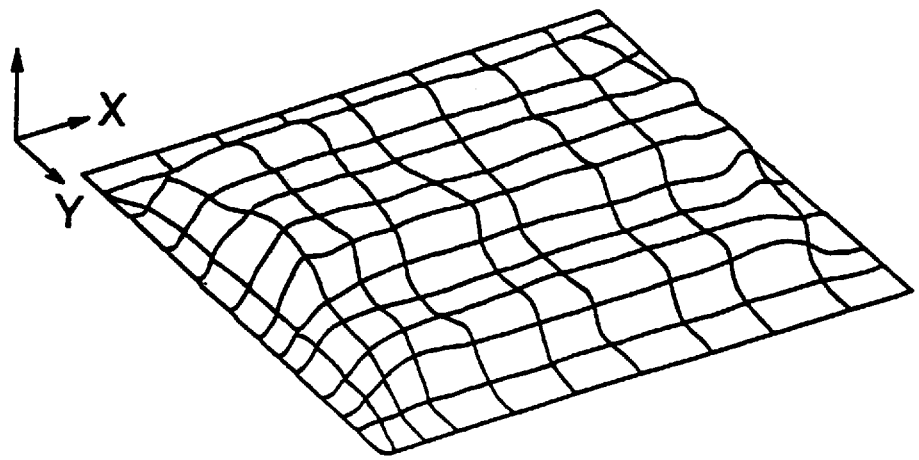
FIG. 14C illustrates simulated results of the target use efficiency.
Figure 14D:
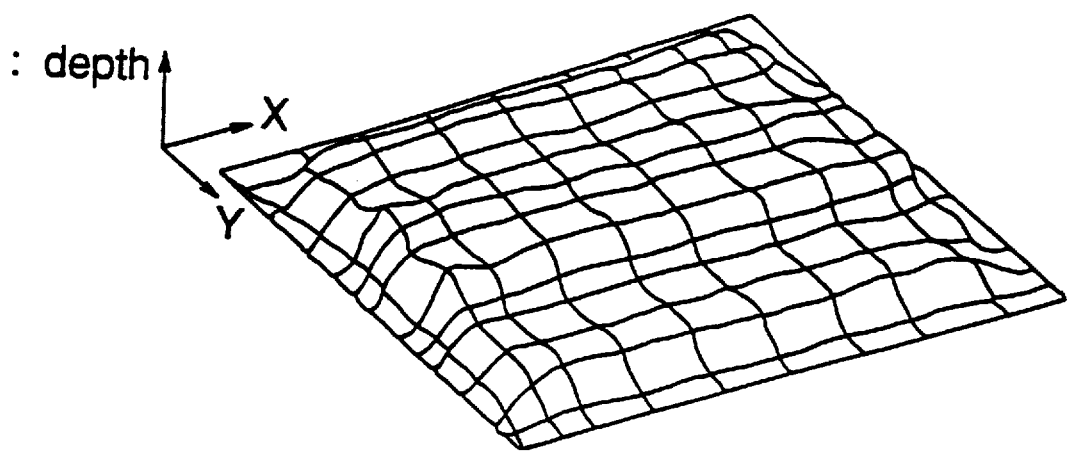
FIG. 14D illustrates simulated results of the target use efficiency.

FIGS. 13A to 13C show the distribution of erosion depth (the depth direction in the figure) resulting from a simulation of the target use efficiency as the amplitude of reciprocation in up-down direction 42 (the X direction) is varied from 0 to 40 mm when the width of the magnetron magnetic circuit is 90 mm and the stroke of the reciprocation in left-right direction 41 (the Y direction) is 120 mm. Here, the size of the magnetron magnetic circuit was 90 mm×652 mm ×35 mm, the magnetic field strength at the target surface was approximately 1300 G, and the phase of motor rotation of reciprocation in the up-down direction was 0 rad. As a result, when the reciprocation amplitude in the up-down direction is 0 mm in FIG. 13A, the use efficiency is 37%. When the reciprocation amplitude in the up-down direction is 20 mm in FIG. 13B, the use efficiency is 43%. When the reciprocation amplitude in the up-down direction is 40 mm in FIG. 13C, the use efficiency is 46%. From the above simulation results, it can be seen that the target use efficiency improves in relation to the reciprocation in the up-down direction 41 as the amplitude increases.

Similarly, FIGS. 14A to 14D show the distribution of erosion depth (the depth direction in the figure) resulting from a simulation of the target use efficiency as the amplitude of reciprocation in left-right direction 41 (the Y direction) is varied from 0 to 120 mm when the width of the magnetron magnetic circuit is 90 mm and the stroke of the reciprocation in up-down direction 42 (the X direction) is 40 mm. Again, the size of the magnetron magnetic circuit was 90 mm×652 mm×35 mm, the magnetic field strength at the target surface was approximately 1300 G, and the phase of the motor rotation of reciprocation in the up-down direction was 0 rad. As a result, when the reciprocation amplitude in the horizontal direction is 0 mm in FIG. 14A, the use efficiency is 12%. When the reciprocation amplitude in the horizontal direction is 80 mm in FIG. 14B, the use efficiency is 28%. When the reciprocation amplitude in the horizontal direction is 100 mm in FIG. 14C, the use efficiency is 39%. When the reciprocation amplitude in the horizontal direction is 120 mm in FIG. 14D, the use efficiency is 46%. From the above simulation results, it can be seen that the target use efficiency improves in relation to the reciprocation in the left-right direction 42 as the amplitude increases.

Figure 15:
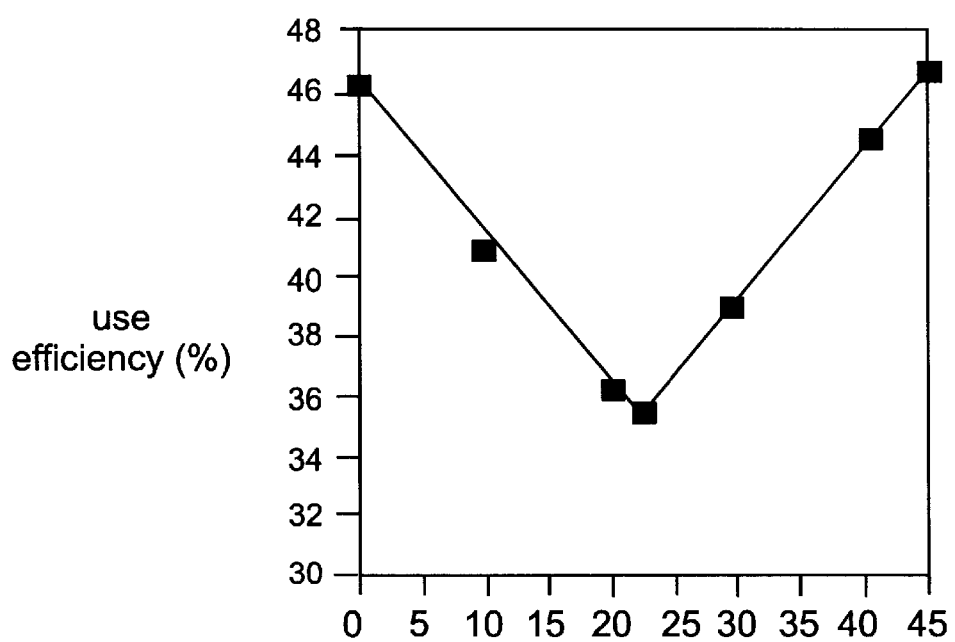
FIG. 15 illustrates the phase difference dependence characteristics of target use efficiency obtained by simulated results.

Also, FIG. 15 shows the dependence of target use efficiency on the phase difference obtained by simulated results. Here, the width of magnetron magnetic circuit 32 was 90 mm, the stroke in the X direction was 40 mm and the stroke in the Y direction was 120 mm. From FIG. 15, it can be seen that when the reciprocation period in the left-right direction is four times the reciprocation period in the up-down direction, the target use efficiency is a maximum when the phase difference is 0 rad or an integer multiple of $\frac{1}{4}\pi$ rad.

To look at it another way, in a sputter deposition system according to the present invention, in relation to the reciprocating motion of the magnetron magnetic circuit, during the time it takes for a point on the substrate to pass by the target, the reciprocating motion in the substrate transfer direction should preferably perform a plurality of reciprocation cycles. If a plurality of cycles of reciprocation are performed in the substrate transfer direction during the time it takes for a point on the substrate to pass by while being transferred, deposition can be performed uniformly on all points of the substrate.

The reciprocating mechanism of a sputter deposition system according to the present invention is not limited to that mentioned above. For example, it is also possible to use a stepping motor as the motor. Also, in the present invention, the shape of the target shield, the gas injection position, and the gas injection method are not limited to those mentioned above.

The sputter deposition system may operate in any of the in-line processing mode, batch processing mode or single substrate processing mode. Although the above-mentioned embodiments have one magnetron magnetic circuit, the number of magnetron magnetic circuits is arbitrarily determined according to the size of the target that is used and the width of said magnetic circuit. The number of magnetron cathodes to be installed is also arbitrarily selected according to necessity. In the case of cluster-tool sputter deposition systems such as the Anelva C-3500 and Anelva C-3900 manufactured by Anelva, where the wafer is normally stationary, one can either make the reciprocation period of the magnetron magnetic circuit much smaller than the deposition time, or said magnetron magnetic circuit can be made to perform an integral number of cycles during deposition.

With the present invention as clarified in the above description, since the magnetron magnetic circuit situated on the rear side of the target is made to reciprocate in directions parallel with and perpendicular to the substrate transfer direction, it is possible to improve the use efficiency of said target and to ameliorate the film thickness distribution of sputtered substrates and the distribution of substrate-to-substrate film properties Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A sputter deposition system for performing sputter deposition comprising:

a sputter deposition chamber having a vacuum enclosure;

pumping means for evacuating an interior of the vacuum enclosure;

a magnetron cathode;

a target attached to the magnetron cathode, the target has a surface that faces into the interior of said vacuum enclosure;

gas feed means that feeds a sputtering gas into the interior of said vacuum enclosure; and substrate transfer means for transferring the substrate into the interior of said vacuum enclosure in a substrate transfer direction;

said magnetron cathode is equipped with a magnetron magnetic circuit positioned behind said target, first reciprocating means that causes said magnetron magnetic circuit to reciprocate in a first direction that is parallel with the surface of said target, and second reciprocating means that causes said magnetron magnetic circuit to reciprocate in a second direction that is different than the first direction and that is parallel with the surface of said target;

wherein the period of the reciprocating motion performed by said first reciprocating means is at least four times the period of the reciprocating motion performed by said second reciprocating means.

2. The sputter deposition system as claimed in claim 1, wherein the first direction is the substrate transfer direction and the second direction is perpendicular to the substrate transfer direction.

3. The sputter deposition system as claimed in claim 2, further comprising means whereby each phase of the reciprocating motions performed by said first reciprocating means and said second reciprocating means can be arbitrarily controlled.

4. The sputter deposition system as claimed in claim 2, wherein said first reciprocating means performs a plurality of cycles of reciprocating motion in the substrate transfer direction during the time it takes for one point on said substrate to pass by said target.

5. The sputter deposition system as claimed in claim 1, wherein at least one of the reciprocating motions performed by said first reciprocating means and said second reciprocating means involves sinusoidal reciprocation.

6. The sputter deposition system as claimed in claim 1, wherein at least one of the reciprocating motions performed by said first reciprocating means and said second reciprocating means involves constant-speed reciprocating characteristics except in the vicinity of the two ends.

7. A method of performing sputter deposition, comprising the steps of:

attaching a target to a magnetron cathode so that a surface of the target faces into an interior of a vacuum enclosure of a sputter deposition chamber, said magnetron cathode is equipped with a magnetron magnetic circuit positioned behind said target;

transferring a substrate into the interior of said vacuum enclosure in a substrate transfer direction;

evacuating the interior of the vacuum enclosure;

feeding a sputtering gas into the interior of said vacuum enclosure;

applying a voltage to the magnetron cathode;

reciprocating a magnetron magnetic circuit in a first direction that is parallel with the surface of said target; and reciprocating the magnetron magnetic circuit in a second direction that is different than the first direction and that is parallel with the surface of said target;

wherein the period of the reciprocating motion in the first direction is at least four times the period of the reciprocating motion in the second direction.

8. The method as claimed in claim 7, wherein the first direction is the substrate transfer direction and the second direction is perpendicular to the substrate transfer direction.

9. The method as claimed in claim 8, wherein each phase of the reciprocating motions can be arbitrarily controlled.

10. The method as claimed in claim 7, wherein at least one of the reciprocating steps involves sinusoidal reciprocation.

11. The method as claimed in claim 7, wherein at least one of the reciprocating steps involves constant-speed reciprocating characteristics except in the vicinity of the two ends.

* * * * *